United States Patent [19]

Nagata et al.

[11] Patent Number: 4,931,618
[45] Date of Patent: Jun. 5, 1990

[54] IMAGE GLAZING DEVICE

[75] Inventors: Syoichi Nagata, Yamatokoriyama; Kunio Ohashi, Nara, both of Japan

[73] Assignee: Sharp Kabushiki Kaisha, Osaka, Japan

[21] Appl. No.: 283,839

[22] Filed: Dec. 13, 1988

[30] Foreign Application Priority Data

Dec. 18, 1987 [JP] Japan .............................. 62-321992
Dec. 18, 1987 [JP] Japan .............................. 62-321993

[51] Int. Cl.⁵ ........................................... G03G 15/20
[52] U.S. Cl. ..................................... 219/216; 219/469
[58] Field of Search .............. 219/216, 469, 470, 471; 355/284, 290

[56] References Cited

U.S. PATENT DOCUMENTS

| | | | |
|---|---|---|---|
| 3,249,738 | 5/1966 | Simm | 219/216 |
| 3,864,709 | 2/1975 | Bruns | 219/216 |
| 3,997,262 | 12/1976 | Doi | 219/216 |
| 4,095,886 | 6/1978 | Koeleman | 219/216 |
| 4,399,209 | 8/1983 | Sanders et al. | 430/138 |
| 4,554,235 | 11/1985 | Adair et al. | 430/138 |
| 4,576,891 | 3/1986 | Adair et al. | 430/138 |
| 4,616,917 | 10/1986 | Sakurai | 355/290 |
| 4,761,311 | 8/1988 | Stone | 219/216 |

*Primary Examiner*—Teresa J. Walberg
*Attorney, Agent, or Firm*—Birch, Stewart, Kolasch & Birch

[57] ABSTRACT

An image glazing device for applying a gloss to an image formed on an image receiving material is accommodated in an image forming apparatus the image glazing device being provided with at least two rollers disposed in a direction of feed of the image receiving material, an image glazing belt passed between and rotatably driven by the two rollers for applying the gloss to the image, a heater accommodated in or disposed in the vicinity of an upstream one of the two rollers for heating the image glazing belt and a paper transport guide located immediately below and along the image glazing belt for transporting the image receiving material wherein the diameter of the downstream one of the two rollers is determined in accordance with the rotating speed of the image glazing belt and the temperature of the image glazing belt at a location where the downstream roller is provided so that image offsetting will not take place. A guide member may be provided at a predetermined angle with the paper transport guide is provided in the vicinity of the downstream roller which is conducive to easy separation of the image receiving material from the image glazing belt.

3 Claims, 5 Drawing Sheets

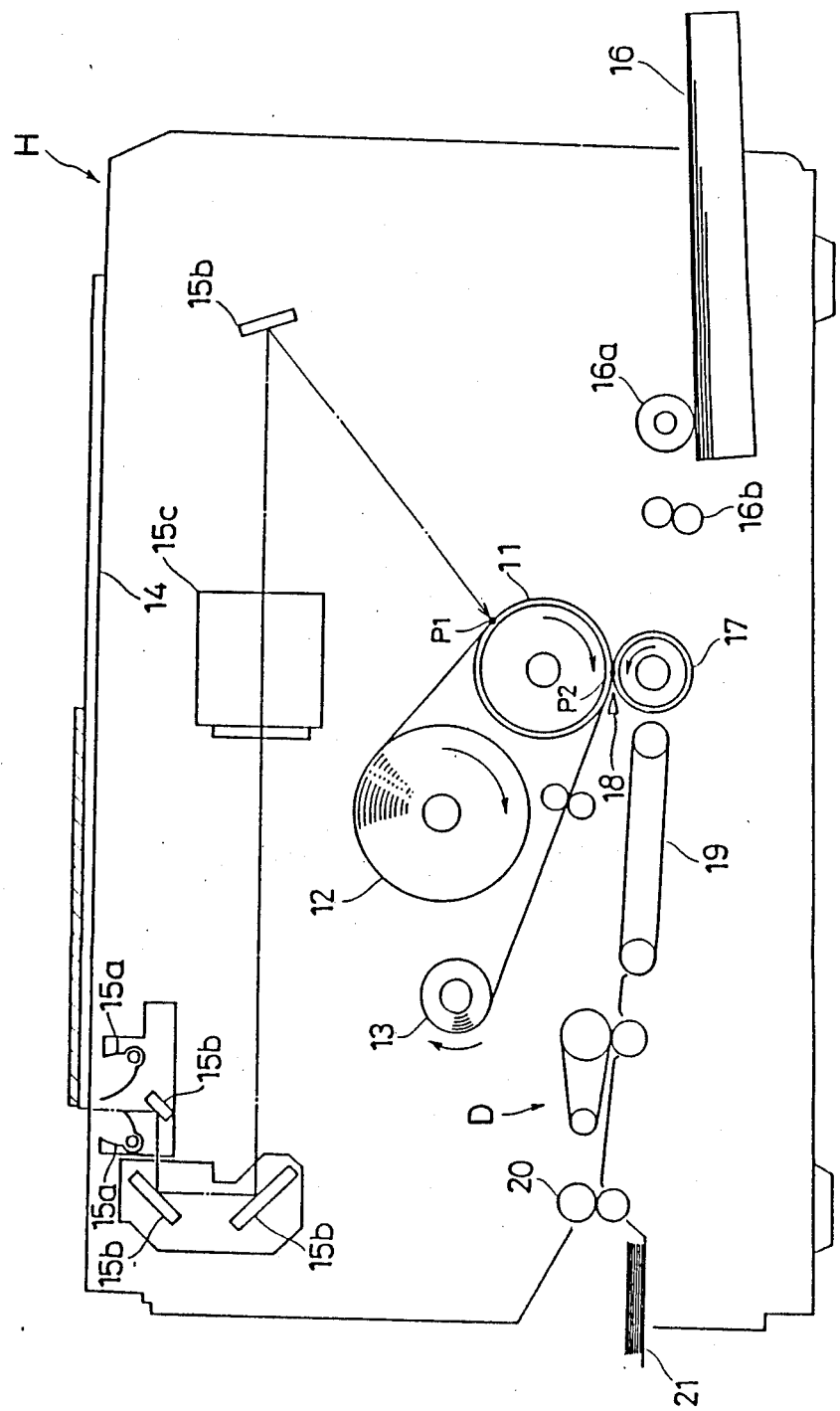

IMAGE GLAZING DEVICE

BACKGROUND OF THE INVENTION

1. Field of the Invention

The present invention relates to an image glazing device for applying a gloss to an image which has been formed on a paper using toner or coloring dye. In this device, the image is subjected to heat, pressure or the like when the gloss is applied thereto.

2. Description of the Prior Art

In a method of forming an image on a paper, a photosensitive member having photoconductivity is electrically charged and exposed to light reflected from an original document so that an electrostatic latent image may be formed thereon. Then, toner is caused to adhere to the electrostatic latent image and transferred onto paper to form a visible toner image thereon.

U.S. Pat. No. 4,399,209 discloses another method in which a photosensitive sheet coated with a large number of microcapsules and an image receiving sheet coated with developing material are used. Each of the microcapsules contains photo-setting material and colorless dye which is colored by the action of the developing material coated on the image receiving sheet. When the photosensitive sheet is exposed to light reflected from an original document, the microcapsules coated thereon are partially hardened to selectively form a hardened image. The image receiving sheet is then overlapped on the photosensitive sheet and subjected to pressure so that unhardened microcapsules may be crushed. In this situation, the colorless dye which flows out of the crushed microcapsules is colored by the developing material of the image receiving sheet to form a colored image. U.S. Pat. No. 4,576,891 discloses such a coloring reaction.

FIGS. 1a and 1b depict a known heating device for heating the image receiving sheet having thereon such a toner or colored image. The device of FIG. 1a is an oven type one in which a paper placed on a transport means 1 is indirectly heated by a plurality of heaters 2 disposed above the transport means 1. The device of FIG. 1b is a contact type one which is provided with a heat roller 3 and a pressure roller 4. The heat roller 3 accommodates a halogen lamp or the like as a heating means. The pressure roller 4 applies pressure to the image receiving sheet supplied between it and the heat roller 3.

In the method of utilizing the photosensitive member with photoconductivity, heating the paper having the toner image thereon softens the thermoplastic resin contained in the toner and fixes the toner.

In the method disclosed in U.S. Pat. No. 4,399,209, heating the image receiving sheet having thereon the colored image expedites the coloring reaction of the colorless dye, resulting in a desirable image. This fact is disclosed in U.S. Pat. No. 4,576,891. Furthermore, as disclosed in U.S. Pat. No. 4,554,235, if thermoplastic pigment is coated on the image receiving sheet, the use of the aforementioned heating device can soften the thermoplastic pigment to add a gloss to the colored image.

However, the device of FIG. 1a employing the indirect heating means can not satisfactorily smooth the thermoplastic resin or pigment. Therefore, this device can not produce a high gloss image. Besides, the relatively low efficiency of the heating means causes the device to be formed undesirably into a large size. Moreover, the paper tends to be slightly curled by the heating and is occasionally brought into contact with one of the heaters. This fact causes the paper to be scorched or set on fire.

In the device of FIG. 1b, the thermoplastic resin or pigment softened by the heating is occasionally caused to adhere to the heat roller and causes an unintentional transfer thereof called "offset". In other words, the thermoplastic resin or pigment adhering to the heat roller is then transferred onto the paper in the subsequent image forming process, thus occasionally spoiling the next image. To prevent this, heat roller requires a relatively large cleaning device, resulting disadvantageously in a large-sized heating device.

SUMMARY OF THE INVENTION

Accordingly, the present invention has been developed with a view to substantially eliminating the above described disadvantages inherent in the prior art heating device employed as an image glazing device, and has for its essential object to provide an improved image glazing device which is capable of producing a high gloss image without causing any offset.

Another important object of the present invention is to provide an image glazing device of the above described type which is simple in construction and stable in functioning, and can be readily manufactured at a low cost.

In accomplishing these and other objects, an image glazing device according to one preferred embodiment of the present invention is provided with at least two rollers disposed in a direction of feed of an image receiving material, an image glazing member passed between and rotatably driven by the two rollers for adding a gloss to an image formed on the image receiving material, a heating means accommodated in or disposed in the vicinity of the upstream one of the two rollers for heating the image glazing member, and a paper transport means located immediately below and along the image glazing member for transporting the image receiving material. In this device, the diameter of the downstream one the two rollers is determined in accordance with the rotating speed of the image glazing member and the temperature of the image glazing member at a location where the downstream roller is provided so that no offset may take place.

In such an image glazing device, the image receiving material having thereon a toner or colored image is transported along with the image glazing member. The image glazing member is gradually heated by the heating means, thereby heating the image receiving material. As a result, thermoplastic resin or pigment contained in the toner or colored image is softened and gloss is imparted to the image. In this event, the image is smoothed by the image glazing member because the former is in close contact with the latter. In this way, the image turns into a high gloss image.

The image receiving material having thereon the high gloss image is further transported by the image glazing member and is gradually cooled down as it travels farther away from the heating means. Accordingly, the image receiving material is relatively low in temperature when it has reached the downstream roller. In view of this fact, the diameter of the downstream roller is determined on the basis of the rotating speed of the image glazing member and the temperature of the image glazing member at the downstream roller, thereby preventing any offset from taking place.

In another aspect of the present invention, the image glazing device is further provided with a guide member which is located in the vicinity of the downstream roller and forms a predetermined angle with the paper transport means. This guide member enables the image receiving material to be easily separated from the image glazing member.

BRIEF DESCRIPTION OF THE DRAWINGS

These and other objects and features of the present invention will become more apparent from the following description taken in conjunction with the preferred embodiment thereof with reference to the accompanying drawings, throughout which like parts are designated by like reference numerals, and in which:

FIG. 2 is a schematic sectional view of an image forming apparatus accommodating an image glazing device according to the present invention;

DETAILED DESCRIPTION OF THE PREFERRED EMBODIMENT

Figure 1A:
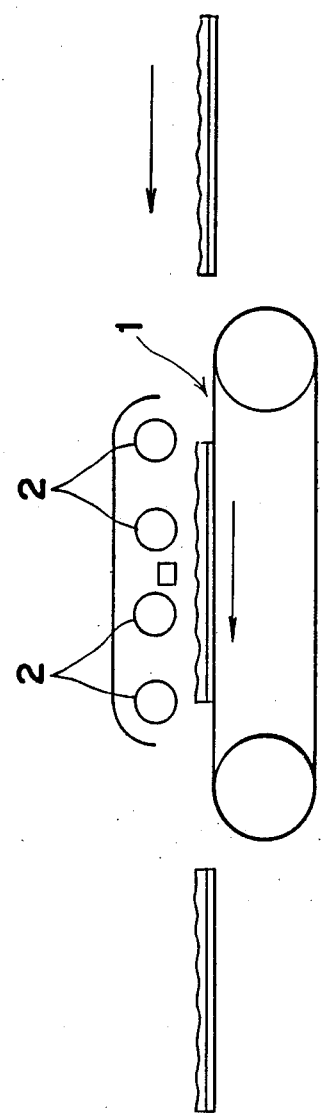
FIG. 1a is a schematic view of a conventional heating device.
Figure 1B:
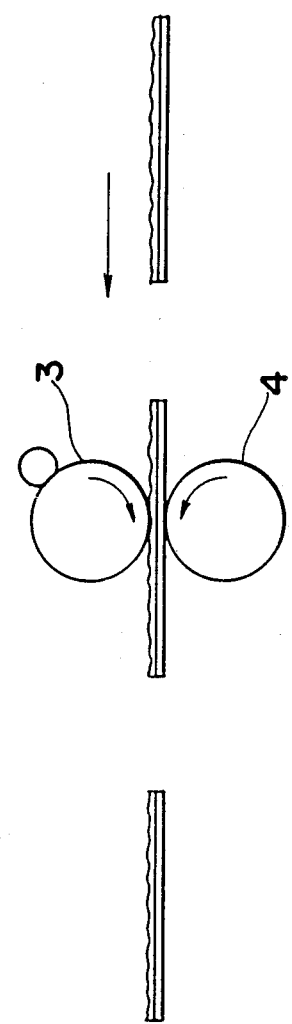
FIG. 1b is a schematic view of another conventional heating device.

Referring first to FIG. 2, an image glazing device D of the present invention for producing a glossy image is accommodated in an image forming apparatus H in which an image is formed with the use of a photosensitive material and an image receiving material. The image forming apparatus of FIG. 2 is a copying apparatus.

The copying apparatus H is internally provided with a main drum 11 substantially at a central portion thereof, a photosensitive sheet supply roller 12 for supplying an unused photosensitive sheet, and a photosensitive sheet take-up roller 13 for taking up a used photosensitive sheet. The supply and take-up rollers 12 and 13 are located to the left of the main drum 11, as viewed in FIG. 2. The photosensitive sheet wound around the supply roller 12 is taken up by the take-up roller 13 by way of the main drum 11. In this configuration, one surface of the photosensitive sheet on which a large number of microcapsules are coated is directed outwards.

On an upper surface of the apparatus body is disposed a document platform 14, below which is disposed an optical system comprised of a plurality of light sources 15a, a plurality of mirrors 15b, and a lens assembly 15c. An original document placed on the document platform 14 is scanned by the optical system so that light reflected from the original document may be led to an exposure point P1 on the main drum 11. As a result, the microcapsules of the photosensitive sheet engaging with the main drum 11 partially harden to form a selectively hardened image.

A paper supply cassette 16 for placing thereon image receiving sheets is detachably mounted in the apparatus body at a side portion thereof. A paper supply roller 16a for supplying the image receiving sheets, one at a time, is disposed above the paper supply cassette 16. Each image receiving sheet supplied from the paper supply cassette 16 stops when it has been brought into contact with a pair of rollers 16b disposed downstream of the paper supply roller 16a. Below the main drum 11 is positioned a pressure roller 17, which is biased against the main drum 11 by virtue of a biasing mechanism (not shown). The location where the main drum 11 and the pressure roller 17 are in contact with each other is referred to as a pressure point P2. The surface of the photosensitive sheet on which the microcapsules are coated and one surface of the image receiving sheet to which developing material is caused to adhere are mated and subjected to pressure at the pressure point P2. The image receiving sheet which has once stopped at the paired rollers 16b is supplied to the pressure point P2 so that the leading edge of the photosensitive sheet having the selectively hardened image formed thereon may be coincident with the leading edge of the image receiving sheet. At the pressure point P2, unhardened microcapsules of the photosensitive sheet are crushed so that colorless dye contained therein may flow out therefrom to effect coloring reaction by the action with the developing material of the image receiving sheet.

A separating claw piece 18 is disposed in the vicinity of the pressure point P2 to separate the image receiving sheet from the photosensitive sheet. The image receiving sheet separated from the photosensitive sheet is then transported towards the image glazing device D by means of a transport belt 19 adjacent to the pressure roller 17. The image glazing device D is positioned substantially below the take-up roller 13 at a left-hand side portion inside the apparatus body, as viewed in FIG. 2. The image formed on the image receiving sheet is turned into a high gloss image by the image glazing device D and is discharged onto a paper discharge tray 21 by means of a pair of paper discharge rollers 20. Accordingly, the paired paper discharge rollers 20 and the paper discharge tray 21 are located downstream of the image glazing device D in reference to the direction of feed of the image receiving sheet.

Figure 3:
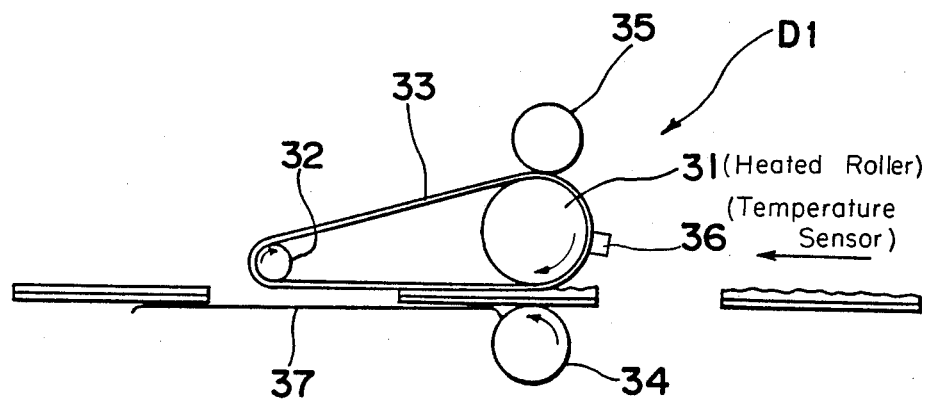
FIG. 3 is a schematic side view of the image glazing device of the present invention.

FIG. 3 depicts the image glazing device D1 for producing a glossy image according to one preferred embodiment of the present invention. The image glazing device D1 is comprised of a heat roller 31, a roller 32 spaced from the heat roller 31, an image glazing belt 33 passed around the rollers 31 and 32, a back-up roller 34 biased against the heat roller 31 and a cleaning roller 35 for cleaning the image glazing belt 33. The image glazing belt 33 is a belt for producing the glossy image and rotates in the clockwise direction, as viewed in FIG. 3, upon rotation of the heat roller 31 and the roller 32. The roller 32 has a diameter smaller than the diameter of the heat roller 31. The image receiving sheet transported by the image glazing belt 33 is separated therefrom at a location where the roller 32 is provided. Accordingly, the roller 32 constitutes a separating portion for separating the image receiving sheet from the image glazing belt and is hereinafter referred to as a separation roller. The cleaning roller 35 removes thermoplastic resin or the like adhering to the image glazing belt 33. However, the cleaning roller 35 is not necessarily required, since the amount of the thermoplastic resin or the like which may adhere to the image glazing belt 33 is negligible.

A material having a smooth surface and superior resistance to heat is preferably employed as the image glazing belt 33. It is also desirable that the material to be employed as the image glazing belt 33 be superior in mold-releasing characteristic, flexibility and durability. Polyester, polyimide, polyethyl ether ketone, polyphenylene sulfide, fluorine resin, silicone resin or the like is employed as the material of the image glazing belt 33. The desirable thickness of the image glazing belt 33 is approximately between 0.02 and 5 mm. Preferably, the image glazing belt 33 has the form of an endless belt. Otherwise, the presence of a joint connecting opposite ends of the material of the image glazing belt 33 complicates the control for this belt. Furthermore, the endless belt can eliminate waste at the joint.

The heat roller 31 is internally provided with a heating means comprised of, for example, a halogen lamp or lamps (not shown) and is controlled in temperature by a temperature sensor 36 which is in contact with the image glazing belt 33. The controlling temperature is in the neighborhood of the softening point of the thermoplastic pigment coated on the image receiving sheet, approximately 125° C. The image receiving sheet is pressed against the image glazing belt 33 by the back-up roller 34. The pressure applied to the image receiving sheet is approximately 4 kg/cm$^2$. A paper transport guide 37 is provided immediately below the image glazing belt 33 and downstream of the back-up roller 34 in reference to the direction of feed of the image receiving sheet.

When the image receiving sheet having thereon a colored image has reached the heat roller 31, the former is heated by the latter so that the coloring reaction may be expedited and gloss may be imparted to the colored image due to the presence of the thermoplastic pigment or resin of the image portion of the image receiving sheet. In this event, the image receiving sheet is subjected to pressure between the heat roller 31 and the back-up roller 34, thereby rendering the thermoplastic pigment to be smoothed and raised in glossiness. The image receiving sheet is then transported downstream along the paper transport guide 37. As the image receiving sheet travels farther away from the heat roller 31, it is gradually cooled down and reaches a condition such that it becomes easily separated from the image glazing belt 33. When the image receiving sheet has reached the separation roller 32, it is separated from the image glazing belt 33 because the image glazing belt 33 is turned up by the separation roller 32.

In this way, the separation of the image receiving sheet from the image glazing belt 33 is performed at a location where the separation roller 32 is provided. According to various experiments made so far, the offset can be prevented by changing the diameter of the separation roller 32 in accordance with the temperature of the image receiving sheet at the separation roller 32 or the rotating speed of the image glazing belt 33. The curvature of the image receiving sheet during the separation depends upon the diameter of the separation roller 32 whereas the rotating speed of the image glazing belt 33 equals to the traveling speed of the image receiving sheet.

Figure 4:
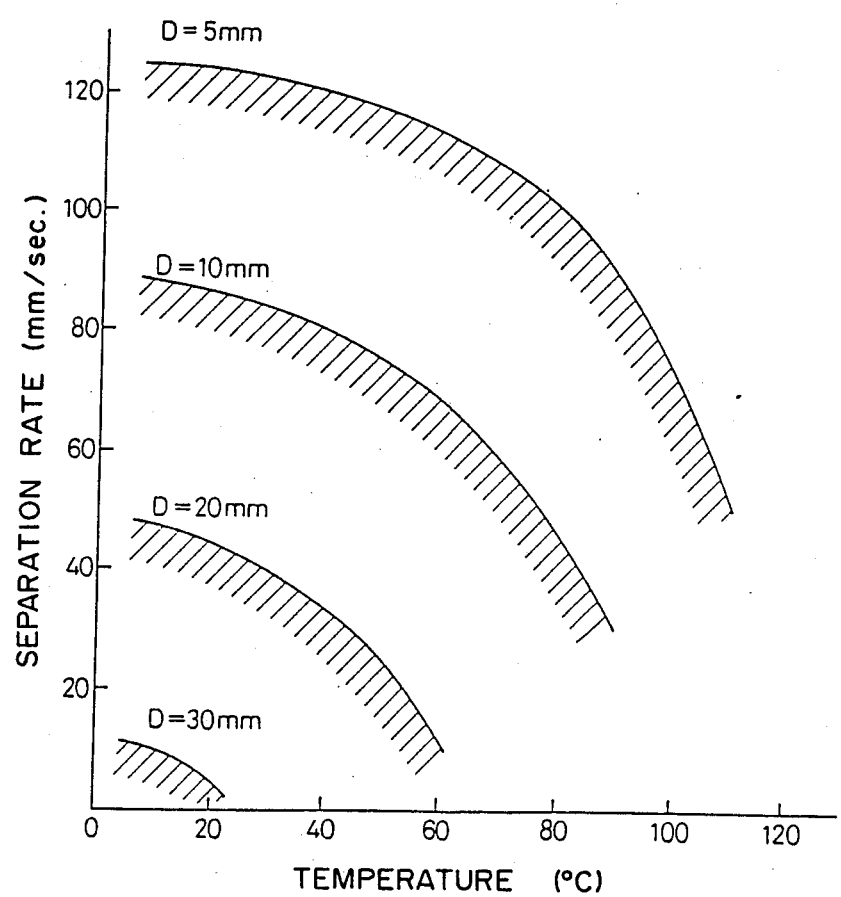
FIG. 4 is a graph indicative of the relationship between the temperature at the separating portion of a separation roller and the separation rate when the diameter of a separation roller changes.

FIG. 4 is a graph indicative of the relationship between the separation rate and the temperature at the separating portion of the separation roller when the diameter of the separation roller 32 has been changed. In this graph, oblique lines indicate areas where no offset takes place.

According to the graph of FIG. 4, no offset takes place by lowering the separation rate even when the temperature of the separating portion is high. For example, in a certain image forming apparatus in which the separation rate i.e., the rotating speed of the image glazing belt 33 is set to 40 mm/sec, the offset would be caused unless the temperature of the separating portion is lower than 30° C. when the diameter of the separation roller 32 is 20 mm. To lower the temperature of the separating portion below 30° C., it is necessary to lengthen the distance between the heat roller 31 and the separation roller 32 to prolong the cooling period of time or to forcibly cool the image receiving sheet by providing a fan or the like between the heat roller 31 and the separation roller 32. However, this is disadvantageous in that the processing time would be increased or the device made to be large in size. To avoid such a disadvantage, the temperature at the separating portion of the separation roller 32 should not be set too low. When the diameter of the separation roller 32 is 10 mm, desirable processing without any offset can be achieved at a temperature approximately below 80° C. This temperature is relatively high, and therefore, it is not necessary to lengthen the image glazing belt 33 or to provide any fan, resulting in a small-sized device. Furthermore, the processing period of time can be shortened.

In the case where the separation rate is increased, the larger diameter of the separation roller 32 requires the lower temperature at the separating portion for the purpose of avoiding any offset. In contrast, the smaller diameter of the separation roller 32 would cause no offset even when the temperature at the separating portion is somewhat high.

It is to be noted that because the separation roller 32 having a very small diameter extremely fatigues the image glazing belt 33, the diameter thereof should be suitably determined in view of the combination of the separation rate and the temperature of the separating portion.

Figure 5:
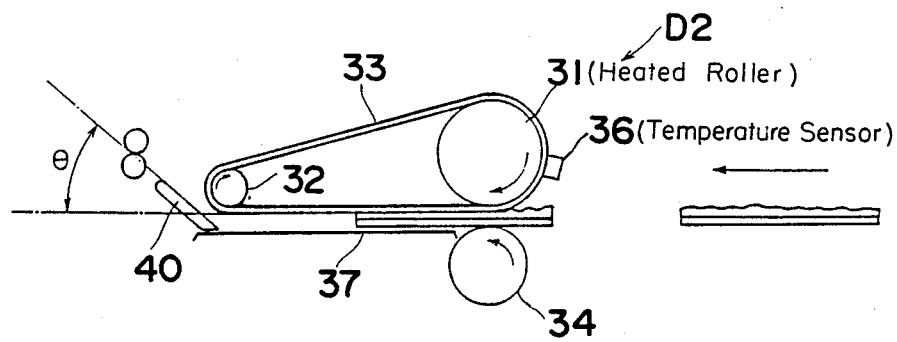
FIG. 5 is a view similar to FIG. 3, which particularly shows a modification of the present invention.

FIG. 5 depicts another image glazing device D2 provided with a guide member 40 in the vicinity of the separation roller 32. The guide member 40 forms a predetermined acute angle $\theta$ with a paper transport plane formed by the paper transport guide 37. This angle is hereinafter referred to as a separation angle. The image receiving sheet which has been transported as far as the separation roller 32 travels along the guide member 40 and is then separated from the image glazing belt 33. In this event, the acute separation angle facilitates the separation and causes no offset.

Figure 6:
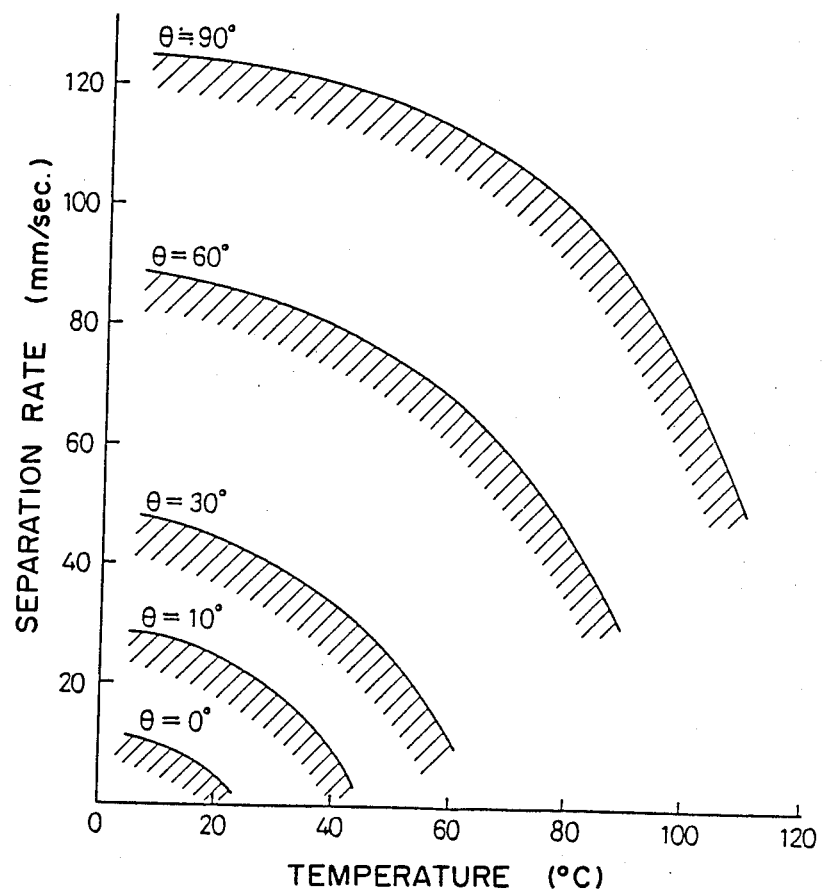
FIG. 6 is a graph indicative of the relationship between the temperature of the separating portion and the separation rate when the separation angle formed between a guide member and a paper transport plane changes.

FIG. 6 is a graph indicative of the relationship between the separation rate and the temperature at the separating portion of the separation roller when the separation angle $\theta$ has been changed. In this graph, oblique lines indicate areas where no offset takes place.

As is clear from this graph, the greater the separation angle $\theta$ is, the broader the area is where no offset takes place, even when the temperature at the separating portion or the separation rate is high. The separation angle $\theta$ of the guide member 40 is preferably set to an angle greater than 30° but should be at least greater than an angle of 10° in practical use. Most preferably, the separation angle $\theta$ should be set to an angle greater than 60°. When the separation angle $\theta$ is greater than 60°, the separation can be done at a relatively high separation rate of 50 mm/sec even when the temperature of the image receiving sheet is about 80° C. Such conditions enable the image glazing processing to be desirably performed within a relatively short period of time using a small-sized device. Furthermore, as the temperature of the image receiving sheet or the separation rate becomes lower, the separation angle $\theta$ can be reduced. The separation angle $\theta$, therefore, should be set in accordance with the temperature, and the separation rate.

As described above, the presence of the guide member 40 facilitates the separation of the image receiving sheet from the image glazing belt 33 and prevents offset from taking place.

It is to be noted that although this embodiment has been described with respect to the glazing of a colored image, an image glazing device of the present invention is applicable to the case where a toner image is required to be glazed.

It is further to be noted that in this embodiment, although a heat roller is employed as a roller accommodating a heating means, the heating means may be provided in the vicinity of the upstream one of the two rollers between which an image glazing belt is passed.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. An image glazing device, for use in an image forming apparatus, for applying a gloss to an image formed on an image receiving material, said device comprising:
   at least two rollers disposed subsequent to development of an image on an image receiving material;
   an image glazing member passed around and rotatably driven by said two rollers for applying a gloss to said image;
   a heating means associated with an upstream one of said two rollers for heating said image glazing member; and
   a paper transport means juxtapositioned to said image glazing member for transporting said image receiving material,
   wherein a diameter of a downstream one of said two rollers is determined in accordance with a rotating speed of said image glazing member and a temperature of said image glazing member at a location where said downstream roller is provided so that image offsetting does not take place.

2. The image glazing device of claim 1, further including a guide member positioned after a downstream one of said two rollers for easy separation of said image receiving material from said image glazing member, said guide member forming a predetermined angle with said paper transport means.

3. The image glazing device according to claim 2, wherein said guide member forms an angle of at least 10° with said paper transport means.

* * * * *